United States Patent
Reese et al.

(10) Patent No.: US 7,965,881 B2
(45) Date of Patent: Jun. 21, 2011

(54) METHODS FOR OBTAINING MRI FREQUENCY MAPS

(75) Inventors: Timothy G. Reese, Medford, MA (US); Van J. Wedeen, Sommerville, MA (US)

(73) Assignee: The General Hospital Corporation, Boston, MA (US)

( * ) Notice: Subject to any disclaimer, the term of this patent is extended or adjusted under 35 U.S.C. 154(b) by 486 days.

(21) Appl. No.: 11/569,024

(22) PCT Filed: May 16, 2005

(86) PCT No.: PCT/US2005/017212
§ 371 (c)(1),
(2), (4) Date: May 19, 2008

(87) PCT Pub. No.: WO2005/114260
PCT Pub. Date: Dec. 1, 2005

(65) Prior Publication Data
US 2008/0240530 A1 Oct. 2, 2008

Related U.S. Application Data

(60) Provisional application No. 60/570,830, filed on May 14, 2004.

(51) Int. Cl.
*G06K 9/00* (2006.01)

(52) U.S. Cl. ......... 382/131; 382/128; 382/154; 600/410
(58) Field of Classification Search .................. 382/128, 382/130, 131, 285, 107, 154; 324/309, 307, 324/306; 600/410, 412, 420, 407
See application file for complete search history.

(56) References Cited

U.S. PATENT DOCUMENTS

| | | | | |
|---|---|---|---|---|
| 6,307,368 | B1 * | 10/2001 | Vasanawala et al. | 324/309 |
| 6,603,989 | B1 * | 8/2003 | Yablonskiy | 600/410 |
| 7,071,690 | B2 * | 7/2006 | Butts et al. | 324/309 |
| 7,078,897 | B2 * | 7/2006 | Yablonskiy et al. | 324/307 |
| 7,603,157 | B2 * | 10/2009 | Feiweier et al. | 600/410 |
| 7,782,054 | B2 * | 8/2010 | Werthner | 324/309 |
| 2006/0264736 | A1 * | 11/2006 | Ehman et al. | 600/410 |
| 2008/0240530 | A1 * | 10/2008 | Reese et al. | 382/131 |

* cited by examiner

*Primary Examiner* — Daniel G Mariam
*Assistant Examiner* — Nancy Bitar
(74) *Attorney, Agent, or Firm* — Quarles & Brady LLP

(57) ABSTRACT

A magnetic resonance imaging (MRI) method includes generating first and second spin populations within each of a plurality of pixels of a slice of an object. These spin populations have different phase histories. For each pixel, MRI signals from those spin populations are acquired at different times These MRI signals can then be used to determine a field strength difference between different pixels of the slice.

22 Claims, 6 Drawing Sheets

METHODS FOR OBTAINING MRI FREQUENCY MAPS

CROSS-REFERENCE TO RELATED APPLICATIONS

This application is a national phase application under 35 U.S.C. §371 of PCT International Application No. PCT/US2005/017212, filed May 16, 2005, which claims the benefit of U.S. Provisional Patent Application Ser. No. 60/570,830, filed May 14, 2004. The contents of these prior applications are incorporated by reference in their entirety.

FIELD OF THE INVENTION

The present invention relates to methods for obtaining MRI frequency maps.

BACKGROUND OF THE INVENTION

Magnetic resonance (MR) imagers are used to obtain images of objects by a process known as magnetic resonance imaging (MRI). Images of an object typically include a plurality of two-dimensional (2D) image sections (slices). Each slice includes a plurality of pixels, at different locations within the slice.

The acquisition of magnetic resonance images from an object, e.g., a heart, brain, or breast, generally includes subjecting the object to a static magnetic field. When subjected to the static magnetic field, MRI active nuclei, e.g., hydrogen nuclei, precess at frequencies proportional to the strength of the magnetic field. MRI signals are obtained from the precessing nuclei. Various properties of the MRI signals depend upon the precessional frequency and, consequently, the magnetic field experienced by the nuclei.

In general, the static magnetic field is inhomogeneous so that the field strength varies as a function of location within the object. Thus, the precessional frequency of the nuclei also varies within the object. In many situations, higher quality magnetic resonance images may be obtained using more homogenous magnetic fields in which field strength variations are reduced or eliminated. Accordingly, MR imagers generally include shim magnets that generate shim fields used to reduce variations in the static magnetic field. The process of adjusting the shim fields generated by the shim magnets is known as shimming. Shim magnets are typically electromagnets so that the strength of the shim fields can be controlled electronically.

Shimming typically requires a determination of variations in the static magnetic field to determine the proper shim field strengths. Variations in the magnetic field may be determined using a frequency map, which is indicative of the precessional frequencies of MRI active nuclei within each pixel of a slice, i.e., at different locations within the object. The spatial variation of the static magnetic field at different pixels is often presented as a field map.

Certain objects can be challenging to shim. For example, objects that move, e.g., the heart, thorax, and abdomen, may change position within the field of the imager and are thus difficult to shim, because they may not return to exactly the same position between movements, e.g., between heartbeats or inhalations.

SUMMARY OF THE INVENTION

The present invention relates to MRI methods. In some embodiments, the MRI methods include obtaining a set of MRI signals from an object. The set of MRI signals can be obtained upon subjecting the object to a single MRI pulse sequence. The set of MRI signals can include a plurality of subsets of MRI signals obtained from different pixels (e.g., volume elements) of the object. In general, the $i^{th}$ subset of MRI signals includes a plurality of MRI signals from the $i^{th}$ pixel. The subsets of MRI signals from different pixels of the object can be used to determine the precessional frequency of MRI active nuclei present within the different pixels. Alternatively, or in combination, the subsets of MRI signals from different pixels of the object can be used to determine variations in the magnetic field strength experienced by the different pixels.

In general, the invention features MRI methods that include generating first and second spin populations within each of a plurality of pixels of a slice, wherein the first and second spin populations are generated with different phase histories. The methods include acquiring MRI signals from the first and second spin populations of each pixel at different times, and using the MRI signals to determine a field strength difference between different pixels of the slice.

In certain embodiments, generating first and second spin populations can include subjecting the slice to a first radio frequency (RF) pulse, subjecting the slice to a second RF pulse, and at a time between the first and second RF pulses, subjecting the slice to a dephasing gradient. The first and second RF pulses can be 45° pulses.

In some embodiments, a frequency map indicative of differences in a precessional frequency of the spin populations in different pixels of the slice is prepared based on based on the field strength differences between different pixels of the object.

In another aspect, the invention features MRI methods that include subjecting an object to first and second radio frequency (RF) excitation pulses spaced apart by less than 1 ms; receiving a set of MRI signals, wherein the set of MRI signals includes a plurality of subsets of MRI signals, each subset of MRI signals including a first echo signal from the first RF excitation pulse and a second echo signal from the second RF excitation pulse, and wherein the MRI signals of a given subset arise from the same pixel of the object, and the MRI signals of different subsets of MRI signals arise from different pixels of the object; and using the subsets of MRI signals to determine a field strength difference between different pixels of the object.

In certain embodiments, the methods can include subjecting an object to a first radio frequency (RF) excitation pulse. The first RF excitation pulse can have a tip angle of less than 90°. The object can be subjected to a second RF excitation pulse. The second RF excitation pulse can have a tip angle of less than 90°. The first and second RF excitation pulses can excite the same slice. The object can be subjected to a dephasing gradient intermediate the first and second RF excitation pulses. The object can also be subjected to a prephasing gradient.

In various embodiments, the object can be subjected to a plurality of readout gradients. During each readout gradient, first and second MRI signals are obtained. The first and second MRI signals obtained during each readout gradient arise from the same pixel. The MRI signals obtained during different readout gradients arise from different pixels. The first and second MRI signals obtained from each pixel are used to determine a magnetic field strength difference experienced by different pixels of the slice.

In some embodiments, the method relates to a method for generating field maps using echo planar imaging (EPI).

In another embodiment, simultaneous echo refocusing (SER) is used to obtain a frequency map, which may be two dimensional, e.g., may include frequency data from each of a plurality of pixels of a slice. All of the data required to prepare the frequency map can be obtained during a single acquisition, such as a single echo planar imaging pulse sequence. The frequency map can be used to shim the applied magnetic field, such as to correct for variations in the field experienced by different pixels of the slice.

The methods advantageously allow a frequency map to be prepared without the need to use data obtained from each of multiple acquisitions. For example, all of the data required to prepare the frequency map can be obtained within the time required for a single heart beat, e.g., less than 1 second, less than 0.5 seconds, less than 0.25 seconds, or less than 0.1 seconds. Because the data can be obtained during a single pulse sequence, errors introduced by background phase variations are limited or prevented. Such errors may be introduced by variations in the position of the slice, variations in the velocity of the slice and/or time-dependent variations in the applied field.

In some embodiments, the methods are used to obtain a frequency map of a slice within a person, e.g., a slice including a portion of a heart, thorax, breast, brain, or abdomen. The frequency map can be used for shimming to correct for variations in the field experienced by different pixels within the slice.

In addition, the method advantageously allows acquisition of a frequency map (e.g., image) within a single echo planar imaging (EPI) acquisition. Frequency maps with reduced position and velocity-induced errors can be acquired in situations where the background phase variation due to position and velocity can be particularly problematic. Examples of such situations include the acquisition of frequency maps for shimming the heart, thorax, and abdomen at high field. Thus, frequency maps and field maps prepared using the single pulse sequence are insensitive to position changes and/or movement of the object.

Unless otherwise defined, all technical and scientific terms used herein have the same meaning as commonly understood by one of ordinary skill in the art to which this invention belongs. Although methods similar or equivalent to those described herein can be used in the practice or testing of the present invention, suitable methods are described below. All publications, patent applications, patents, and other references mentioned herein are incorporated by reference in their entirety.

Other features and advantages of the invention will be apparent from the following detailed description, and from the claims.

DETAILED DESCRIPTION OF THE INVENTION

Figure 1:
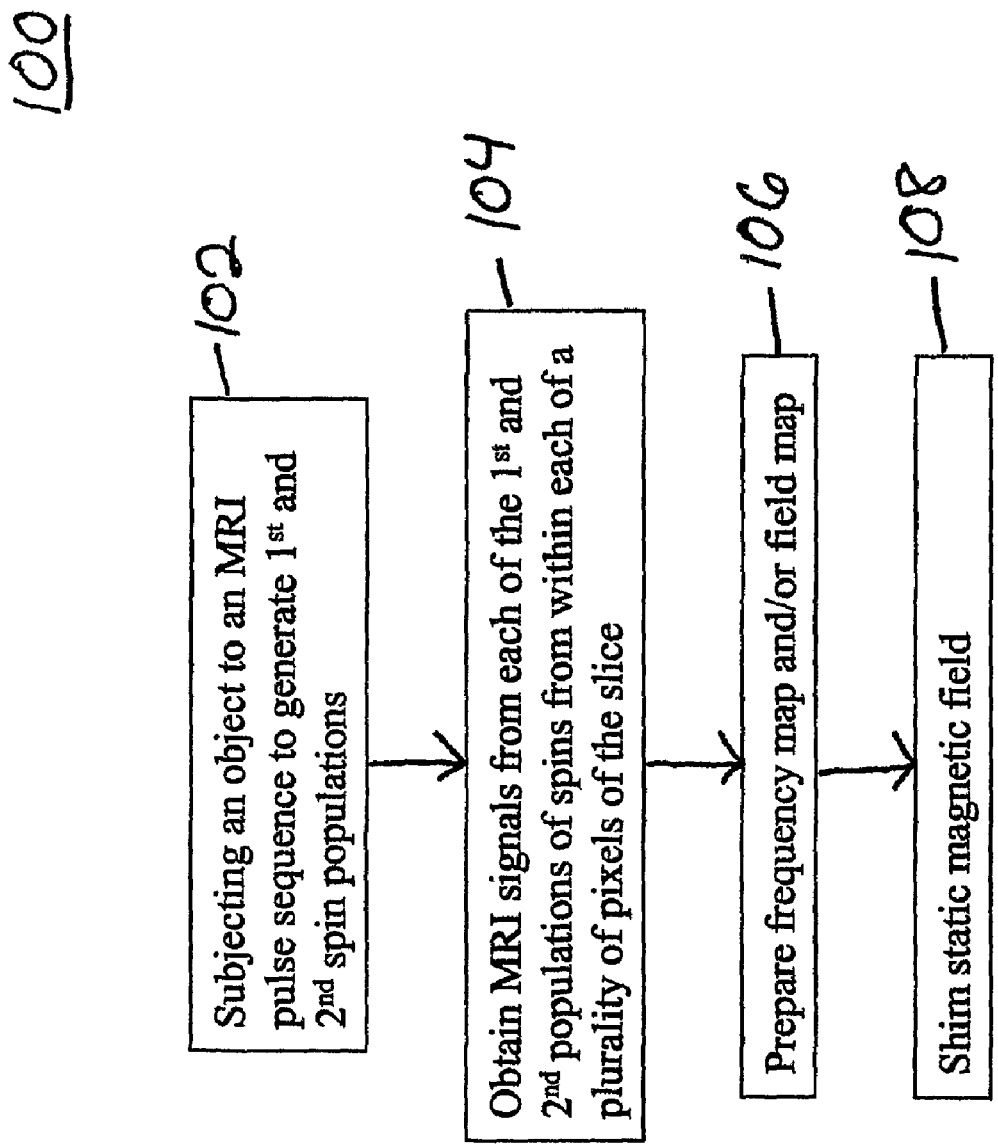
FIG. 1 is a flow chart of a method for preparing a frequency map and/or field map of an object imaged by MRI.

Referring to FIG. 1, a method 100 for preparing a frequency map and/or a field map of an object imaged by MRI includes step 102, subjecting an object to an MRI pulse sequence that generates first and second spin populations within a slice of the object, and step 104, obtaining respective first and second MRI signals from the first and second spin populations present within each of a plurality of pixels (e.g., volume elements) of the slice of the object. The first and second MRI signals from the plurality of pixels can be used in step 106, preparing a frequency map and/or a field map indicative of variations in the static magnetic field within a portion of the object corresponding to the imaged slice. The frequency map and/or field map can be used in step 108, shimming the static magnetic field to reduce the variations in the static magnetic field experienced by the object.

In general, subjecting the object to an MRI pulse sequence includes generating the second spin population a time $\Delta\tau$ later than the first spin population. For example, the MRI pulse sequence can include a pair of RF excitation pulses spaced apart by $\Delta\tau$, which time is typically less than the repeat time TR of known spin echo imaging (SEI) or gradient echo imaging pulse sequences. The time $\Delta\tau$ can be substantially less than the echo time (TE) of the MRI signals, e.g., the ratio $\Delta\tau/TE$ can be 0.02 or less, 0.01 or less, or 0.005 or less. In some embodiments, the time $\Delta\tau$ can be about 1 ms or less, 500 μs or less, e.g., about 300 μs or less, e.g., about 200 μs or less. Each excitation pulse generally excites only a portion of the available magnetization within the slice, e.g., the sum of the tip angles of the excitation pulses can be 90° or less.

The first and second spin populations are generated with different phase histories. For example, the imaged slice of the object can be subjected to a dephasing gradient intermediate the excitation pulses.

Obtaining respective first and second MRI signals (step 104) generally includes subjecting the object to a plurality of readout gradients. During each readout gradient, the first and second MRI signals are obtained from a respective pixel of the imaged slice. The first and second MRI signals are typically spin echoes or gradient echoes of the corresponding first and second excitation pulse. The step 104 of obtaining MRI signals may include subjecting the object to a prephasing gradient that orients the first and second MRI signals in time with respect to each gradient echo.

The first and second MRI signals typically include a real component and a quadrature component indicative of the phase of the signal. Because the first and second spin populations are generated at different times and with different phase histories, the MRI signals obtained from the $i^{th}$ pixel of the slice exhibit a phase difference $\Delta\phi_i$ that depends upon the precessional frequency $\omega_i$ of the populations of spins within the pixel by $\omega_i = \Delta\phi_i/\Delta\tau$.

The precessional frequency $\omega_i$ is related to the local magnetic field $B_{oi}$ experienced by the $i^{th}$ pixel by $\omega_i = \gamma B_{oi} = \gamma(B_o + \Delta B_{oi})$, where $\gamma$ is a constant specific to each MRI active nuclei, $B_o$ is the average magnetic field strength, and $\Delta B_{oi}$ is the variation from the average field strength of the field strength within the $i^{th}$ pixel. Thus, spin populations within a pixel experiencing a local magnetic field that differs from the average magnetic field by $\Delta B_{oi}$ exhibit a precessional frequency that differs from the average precessional frequency by $\Delta \omega_i$. The MRI signals can be used to prepare 106 a frequency map indicative of, e.g., the precessional frequency variations $\Delta \omega_i$ and/or a field map indicative of, e.g., the field strength variations $\Delta B_{oi}$ at different pixels within the object.

In some embodiments, method 100 includes subjecting the slice to a single pulse sequence to obtain MRI signals sufficient to prepare a frequency map and/or a field map for a plurality of pixels of the slice, e.g., at least about 64 pixels or at least about 128 pixels. The frequency map and/or the field map can be used to shim 108 the magnetic field to reduce or eliminate the field strength variations $\Delta B_{oi}$ experienced by different pixels.

MRI Pulse Sequence for Acquiring Single-Shot Frequency Maps

Figure 2:
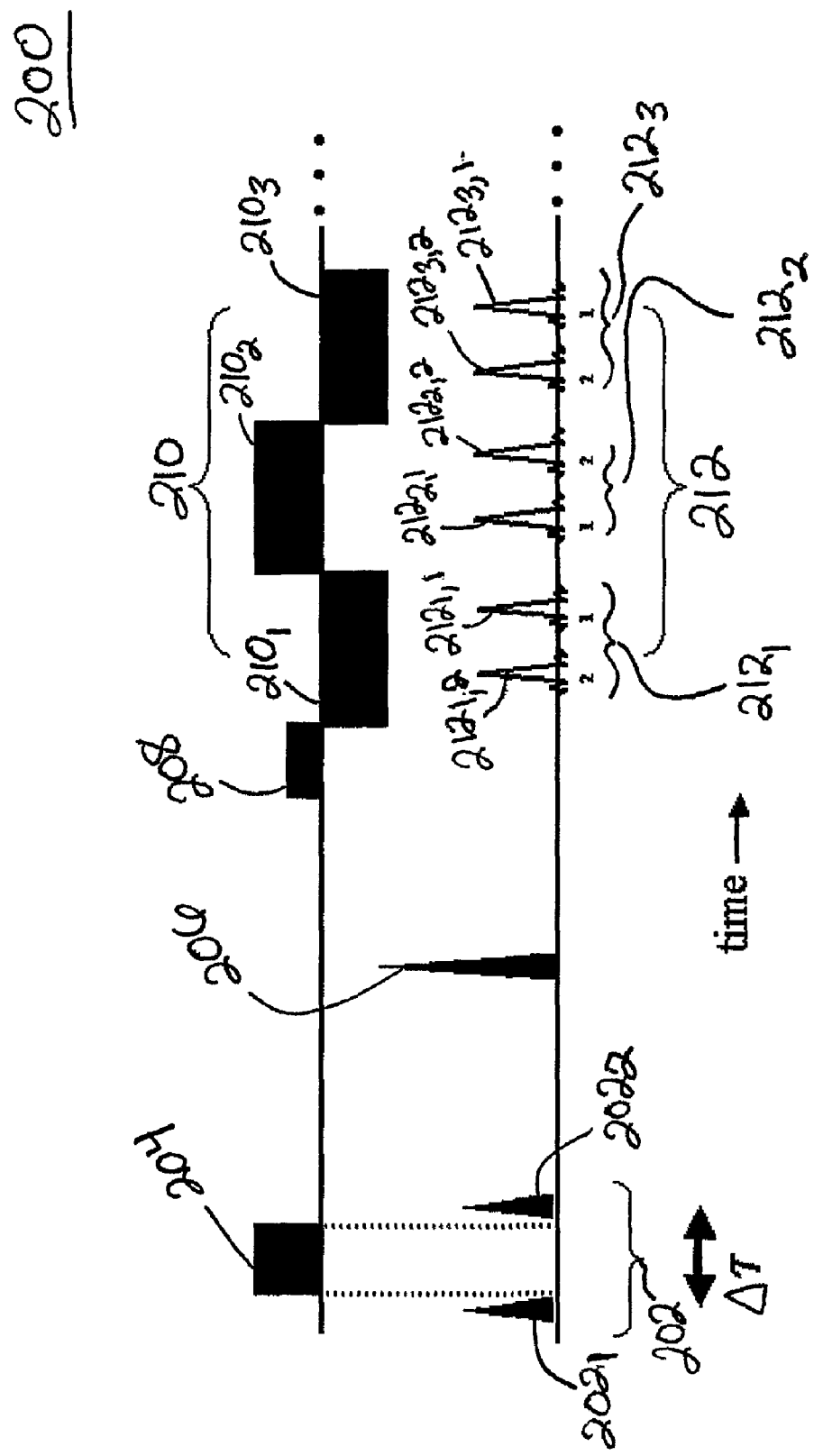
FIG. 2 is a pulse sequence for obtaining MRI signals useful for preparing a frequency map and/or field map of an object imaged by MRI.

Referring to FIG. 2, an MRI pulse sequence 200 includes a set 202 of radio frequency RF excitation pulses including, in this embodiment, first and second excitation pulses $202_1$, $202_2$ spaced apart by a time $\Delta \tau$. Pulse sequence 200 also includes a dephasing gradient 204 applied intermediate the first and second excitation pulses $202_1$, $202_2$, a rephasing pulse 206, a prephasing gradient 208, and a set 210 of readout gradients 210$i$, where i is typically a power of 2, e.g., 64, 128 or 256. The combination of the first and second excitation pulses $202_1$, $202_2$, and the dephasing pulse 204 may be referred to as a compound evolution pulse.

Upon subjecting an object, e.g., one or more organs (e.g., the heart or brain) or body parts (e.g., chest or head) of a person, to pulse sequence 200, a set 212 of MRI signals is obtained. Set 212 includes a plurality of subsets 212$i$ of MRI signals, where the i$^{th}$ subset of MRI signals includes MRI signals received during the i$^{th}$ readout gradient. Each subset 212$i$ of MRI signals includes a pair of respective MRI signals with each MRI signal corresponding to one of the excitation pulses. For example, subset $212_2$ includes a first MRI signal $212_{2,1}$ and a second MRI signal $212_{2,2}$. Before further discussing the set 212 of MRI signals, pulse sequence 200 is discussed in more detail.

First and second excitation pulses $202_1$, $202_2$ are typically slice-selective and, in combination, excite the same slice twice. Generally, the first and second excitation pulses have the same frequencies and, taken individually, are of a duration and amplitude insufficient to tip all of the available magnetization into the transverse plane. For example, in some embodiments, the respective tip angles of the first and second pulses are adjusted to divide the magnetization equally between the two pulses, e.g., each of the first and second pulses may be a 45° excitation pulse, although they need not be equal. For a given pulse amplitude and field strength, the duration of each excitation pulse may be equal to one-half the duration of a 90° excitation pulse, e.g., under conditions in which a 2.56 ms excitation pulse would operate as a 90° excitation pulse, the first and second pulses $202_1$, $202_2$ may each have a duration of 1.28 ms.

Dephasing gradient 204 applied intermediate the first and second pulses $202_1$, $202_2$ ensures that the respective first and second spin populations created by the excitation pulses have different phase histories. Thus, upon completion of the first and second excitation pulses and dephasing gradient, each pixel within the excited slice includes first and second spin populations with different phase histories. Because of the different phase histories of the first and second spin populations, a phase difference $\Delta \phi_i$ evolves between the spin populations.

Rephasing pulse 206 flips the spins of the first and second populations within the transverse plane. Pulse 206 is optional.

Subsequent to subjecting the slice to the first and second pulses $202_1$, $202_2$, dephasing gradient 204, and optional pulse 206, the slice is subjected to prephasing gradient 208, which orients the subsets 212$i$ of MRI signals in time with respect to the corresponding readout gradient 210$i$. Typically, the prephasing gradient 208 has an area equal to ¼ of each of the readout gradients 210 so that each subset of pulses is centered with respect to the corresponding readout gradient. Also, the prephasing gradient 208 generally has an area equal to ½ the area of the dephasing gradient 204. It should be understood, however, that prephasing and dephasing gradients with other relative areas may be useful.

The slice is the then subjected to the set 210 of readout gradients 210$i$. During the i$^{th}$ readout gradient, first and second MRI signals $212_{i,1}$ and $212_{i,2}$ are obtained from the i$^{th}$ pixel of the slice. The first and second MRI signals $212_{i,1}$ and $212_{i,2}$ obtained from the i$^{th}$ pixel are indicative of the phase difference $\Delta \phi_i$ between the corresponding spin populations within the pixel. The MRI signals $212_{i,1}$ form a first echo train that can be used to prepare a first image of the slice, and the MRI signals $212_{i,2}$ form a second echo train that can be used to prepare a second image of the slice. The first and second images have different phase evolutions. As discussed below, a frequency map and/or field map can be determined from the set 212 of MRI signals, e.g., from the first and second echo trains.

It should be understood that compound evolution pulses are not limited to only two excitation pulses and one dephasing gradient. For example, a compound evolution pulse may include at least three excitation pulses and at least two dephasing gradients, one intermediate the first and second excitation pulses and one intermediate the second and third excitation pulses. Such a compound evolution pulse may provide enhanced dynamic range in certain situations.

MRI Pulse Sequence for Acquiring Single-Shot Frequency Maps with Velocity Encoding If a pixel within an object is moving when subjected to the dephasing gradient 206 of pulse sequence 200, the phase evolution of the spin population excited by excitation pulse $202_1$ will be different from the phase evolution of the spin population excited by excitation pulse $202_2$. Movement of the pixel introduces an additional phase shift in the resulting MRI signals, which phase shift is referred to as "velocity encoding." The additional phase shift can introduce errors into frequency maps and/or field maps prepared using the velocity encoded MRI signals.

Constant velocities within an object do not, however, introduce errors if both spin populations are subjected to equal velocity encoding. Additionally, only velocity encoding resulting from the dephasing gradient intermediate the excitation pulses is of concern because only the spin populations excited by the second excitation pulse are influenced by the dephasing gradient.

Figure 3:
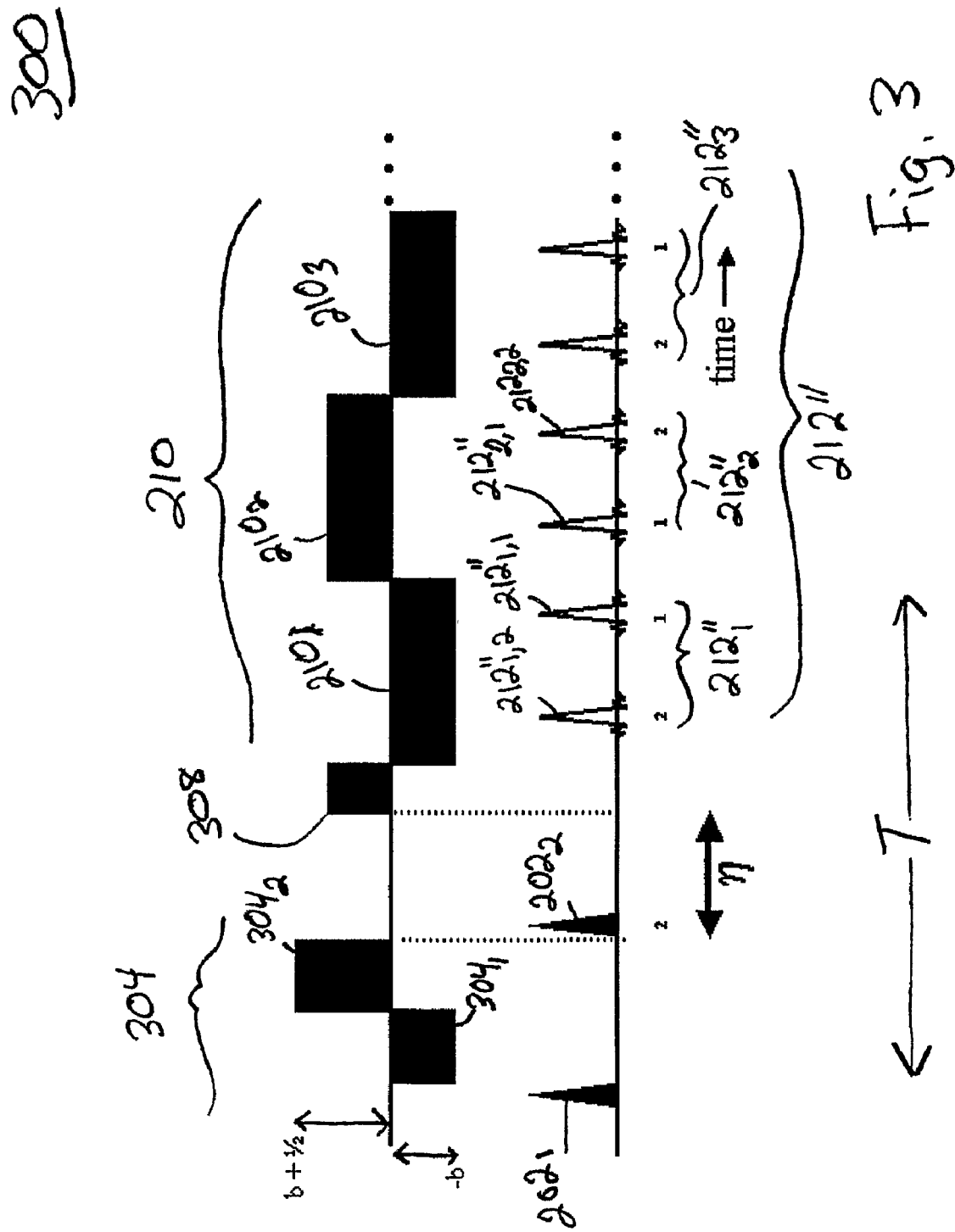
FIG. 3 is a pulse sequence for obtaining MRI signals useful for preparing a frequency map and/or field map of an object imaged by MRI. The pulse sequence encodes the velocities of individual pixels within the object.

Referring to FIG. 3, an MRI pulse sequence 300 compensates for velocity encoding introduced by movement of an object. Pulse sequence 300, which may be referred to as a gradient recalled echo sequence, includes set 202 of radio frequency RF excitation pulses including, in this embodiment, first and second excitation pulses $202_1$, $202_2$ spaced apart by time $\Delta \tau$. Pulse sequence 300 also includes a dephasing gradient 304 applied intermediate the first and second pulses $202_1$, $202_2$, a prephasing gradient 308, and a set 210 of readout gradients 210$i$, where i is typically a power of 2, e.g. 64, 128 or 256. During each respective readout gradient 210$i$, a subset of MRI signals 212$i$'' is obtained. Each subset of MRI signals includes a signal corresponding to a first one of the excitation pulses and a signal corresponding to a second one of the excitation pulses.

In some embodiments, velocity compensation is accomplished by nulling the zero and first gradient moment at the first MRI signal corresponding to the first excitation pulse, i.e., MRI signal $202_{1,1}"$. Such nulling is accomplished by setting the sum of the gradients intermediate the first excitation pulse $202_1$ and its corresponding first MRI signal $202_{1,1}"$ to zero. In general, this nulling condition may be expressed as $$\int_T G(t)dt = v \int_T tG(t)dt = 0,$$

where G(t) is the applied gradients, v is any constant velocity, and T is the time of signal evolution between the excitation and the null. Any velocity encoding subsequent to the null is irrelevant to field and frequency mapping because both echo trains experience an equal effect.

The gradients of pulse sequence 300 meet the nulling condition as follows. Prephasing gradient 304 includes a first portion 304₁ having an amplitude of −b and a second portion 304₂ having an amplitude of b+½. Each of the first and second portions is 4 time units in length. Thus, prephasing gradient 304 has a total area of 2 units. Prephasing gradient 308 has a length of 1 unit in time and one unit in amplitude. Each of the readout gradients 210ᵢ is 4 units in length and 1 unit in amplitude. MRI signal $202_{1,1}"$ occurs ¾ of the length along readout gradient 210₁. Accordingly, the total area of the gradients intermediate the first excitation pulse 202₁ and its corresponding first MRI signal $202_{1,1}"$ is zero.

In general, gradients having other lengths and amplitudes may be used. The lengths and amplitudes of the various gradients are selected based upon typical RF pulse durations, EPI readout times, and static magnetic field strengths. The amplitude parameter b of prephasing pulse 304 accounts for the evolution time η needed to insert the second excitation RF pulse and any additional encoding gradients. When η=0, the amplitude of the velocity compensating gradient 304 may revert to a classic 1:−2:1 ratio. In the present case, $$b = \frac{11}{16} + \frac{\eta}{8},$$

which is a reasonable gradient amplitude.

A spin echo sequence similar to the gradient echo sequence 300 could be used to velocity compensate the spin echo sequence. In some situations, however, the increased evolution time η may render the needed prephasing amplitudes impractical. Additionally, prephasing gradient 308 of pulse sequence 300 could be velocity compensated. However, the time between the prephasing gradient 308 and its first null is short and, therefore, is substantially unaffected by constant velocities within an object.

Preparation of Frequency Maps

As discussed above, each pulse sequence includes a set of RF excitation pulses and a set 210 of readout gradients. During each readout gradient 210i, an MRI echo signal corresponding to each of the RF excitation pulses is obtained from the $i^{th}$ pixel of the slice. During successive readout gradients, echo signals are obtained from different pixels of the slice. Thus, during each pulse sequence, a data set including a train of MRI echo signals from each excitation pulse is obtained.

Each train of MRI echo signals can be used to prepare a complex image including phase information about the spin populations within each pixel of the slice. For example, a pulse sequence including a number Ne of excitation pulses and a number Nr of readout gradients 210 (with i=1, 2, 3, . . . Nr) may be used to prepare a number Ne of images, one image from each of the Ne populations of spins created by the Ne excitation pulses. Each image is of a slice including a number Nr of pixels. In the following discussion, it is assumed without limitation that the pulse sequence includes two RF excitation pulses, e.g., pulses 202₁ and 202₂. The echo signals obtained during each pulse sequence can be used to prepare a 2D data set including two complex images of the slice.

The precessional frequency within the $i^{th}$ pixel of the slice may be determined from the phase difference $\Delta\phi_i$ between the echo signals obtained during the $i^{th}$ readout gradient and from the evolution time of the phase difference, which is generally the time $\Delta\tau$ separating the excitation pulses. As discussed above, the precessional frequency $\omega_i$ of the spin populations within the $i^{th}$ pixel is given by $\omega_i = \Delta\phi_i/\Delta\tau$, where $\omega_i$ is in radians per second. The MRI signals can be used to determine precessional frequency as $$\omega_i = 1/(2\Delta\tau) \times (\arg[212_{i,1}/212_{i,2}])$$

where arg[ ] is the polar angle operator and $212_{i,1}/212_{i,2}$ are the complex image values for the $i^{th}$ pixel. Because the precessional frequency $\omega_i$ is related to the magnetic field experienced by the $i^{th}$ pixel and the magnetic field experienced by each pixel is sensitive to variations $\Delta B_{oi}$ in the magnetic field, the precessional frequencies $\omega_i$ can be used to prepare a frequency map indicative of the variations $\Delta B_{oi}$ in the static magnetic field. In some embodiments, the frequency map is indicative of variations $\Delta\omega_i$ in the frequencies, which may be expressed as, for example, a difference between the precessional frequency of the spin populations of the $i^{th}$ pixel and a reference frequency, e.g., the average precessional frequency of all the spin populations.

Methods for determining phase differences and preparing frequency maps from MRI signals are discussed in Reese et al., "Automated Shimming at 1.5 T Using Echo-Planar Image Frequency Maps," J. Magnetic Resonance Imaging, 5:739-745, (1995), ("Reese"), which paper is incorporated herein by reference in its entirety.

Frequency maps may be used, for example, to distinguish among various tissues present in the object as in fat suppression and, as discussed elsewhere herein, to prepare field maps useful for shimming.

Shimming Using a Frequency Map and/or Field Map

Typical MR imagers include a plurality of shim magnets. The field strengths of the shim magnets can be adjusted to locally increase or decrease the static magnetic field generated by the imager to reduce or eliminate variations $\Delta B_{oi}$ between different pixels of a slice of an object present within the static field. For example, some systems, e.g., a 1.5 T GE Signa clinical imaging system (GE Medical Systems, Milwaukee, Wis.) include four shim parameters: X1, Y1, and Z1 (related to the linear field gradient along the x, y, and z axes of the static magnetic field), and Z2 (which may be an axially symmetric basis element given by a function of the linear field gradients).

The shim parameters of the MR imager form a basis set that can be fit to a frequency map and/or field map obtained from an object within the static magnetic field to provide a model, e.g., a spherical harmonics model, of the static field. The fitting parameters obtained from the fit are indicative of the field strength variations $\Delta B_{oi}$. The field strengths of the shim magnets are modified based upon the fitting parameters to provide a more homogenous magnetic field within the object. Shimming methods using frequency maps are discussed in the paper by Reese et al.

EXAMPLES

The following examples are illustrative and not limiting.

Example 1

Obtaining MRI Signals

A General Electric 1.5T Signa MR scanner (LX, 8.2.5) with a custom 12×20 cm flexible linear surface coil was used to generate pulse sequence and obtain the MRI signals from a living subject's heart. Pulse sequences were generated and MRI signals obtained during each of 8 different cardiac cycles.

Figure 4:
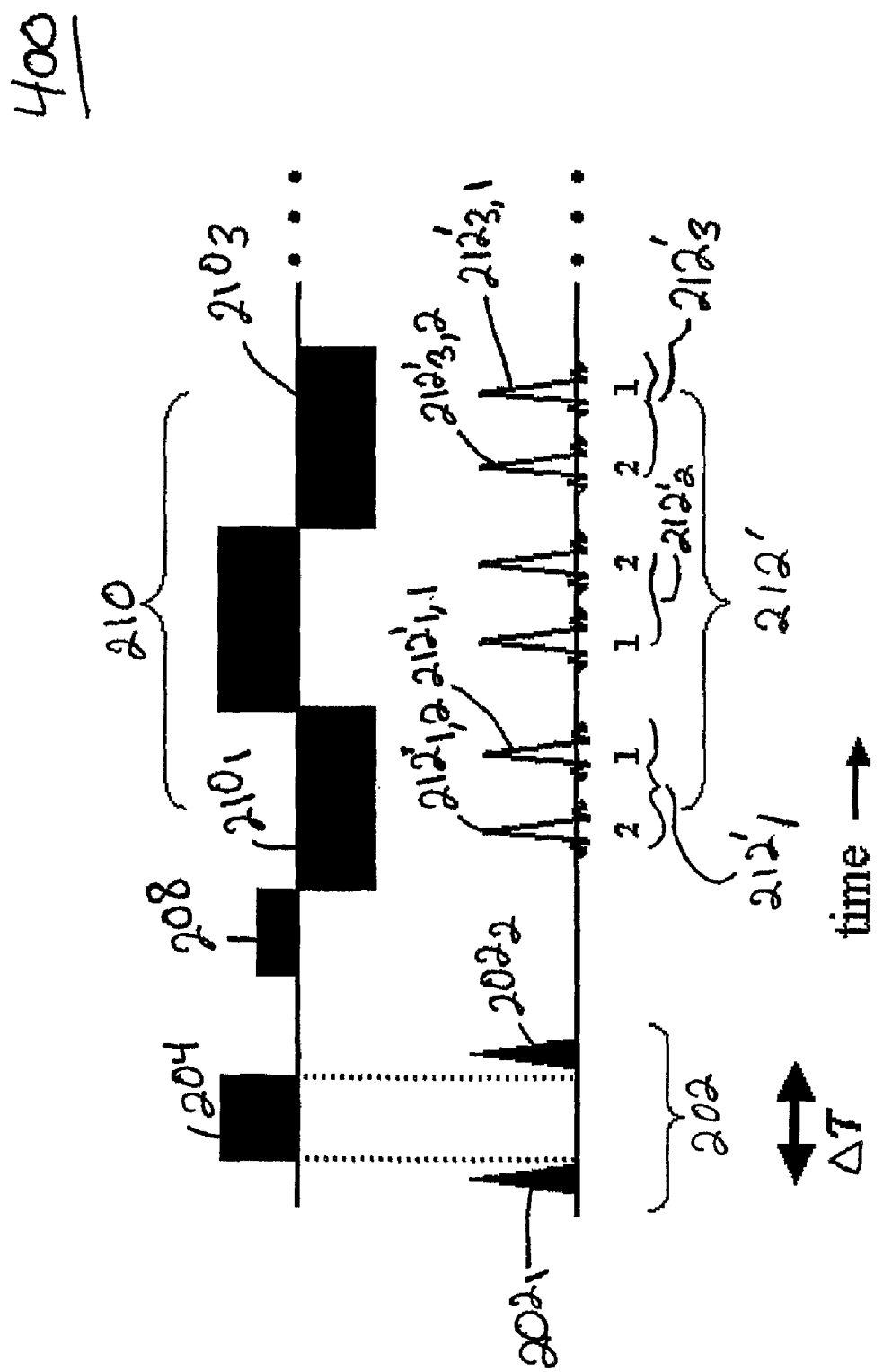
FIG. 4 is a pulse sequence for obtaining MRI signals useful for preparing a frequency map and/or field map of an object imaged by MRI. The pulse sequence does not include a rephasing radio frequency pulse.
Figure 5:
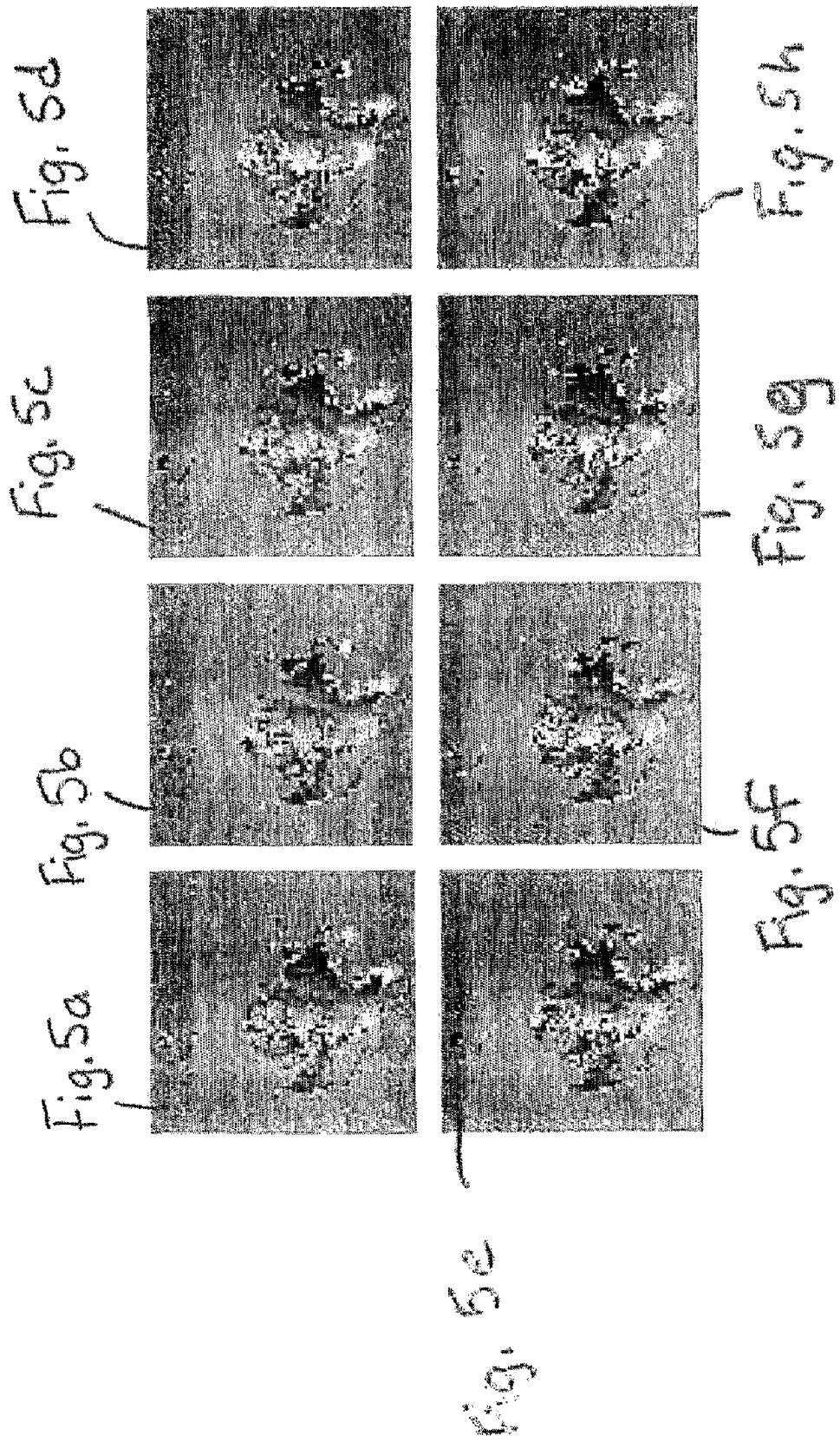
FIGS. 5a-5h are frequency maps prepared using MRI signals obtained using the pulse sequence of FIG. 4.

Referring to FIG. 4, each pulse sequence was a gradient echo MRI pulse sequence 400. Each pulse sequence 400 included first and second RF excitation pulses $202_1$, $202_2$, a dephasing gradient 204 and a prephasing gradient 208. A rephasing pulse was not used. Each excitation pulse $202_1$, $202_2$ was a 45° pulse. Each pulse sequence 400 excited the same slice twice during a single shot.

Pulse sequence 400 also included a plurality of readout gradients $210i$. During the $i^{th}$ readout gradient, a subset $212i$ of MRI signals was acquired. The $i^{th}$ subset of MRI signals included a respective MRI signal corresponding to each of the RF excitation pulses $202_1$, $202_2$. Each MRI signal was a gradient spin echo.

Each acquisition was velocity encoded with a velocity sensitization (VENC) of 6.3 cm s$^{-1}$ and was synchronized with the subject's electrocardiogram (ECG). Methods for encoding MRI acquisitions with velocity sensitization are discussed in the paper Reese et al., "Phase Contrast MRI of Myocardial 3D Strain by Encoding Contiguous Slices in Single Shot," Mag. Res. Imag. Med., 47:665-676, 2002, which paper is incorporated herein by reference. During acquisitions, subjects held their breath for each different velocity encoding vector.

The set 212' of MRI signals obtained from each pulse sequence 400 was used to prepare an MRI image of the subject's heart. Each image had a matrix size of 64×64 pixels (although MRI signals were acquired from a slice including 128×64 pixels). The thickness of each slice within the image was 5 mm. The separation between slices was 12 mm. The in-plane resolution within each slice was 3.75 mm. The echo time (TE) was 47 ms.

Each pulse sequence 400 multiplexed MRI signals from two sequentially encoded spin populations of a single slice into a single echo planar imaging readout (set 212' of MRI signals), which was prepared as a readout matrix. Each line of the readout matrix contained a pair of echoes with different phase evolutions (e.g., a pair $212'_1$ of MRI signals on a first line and a pair $212'_2$ of MRI signals on a second line). The echoes of each line were from the same slice but were excited at a different time. The time $\Delta\tau$ separating the pairs of echoes was between about 200 μs and about 300 μs. Because of the short spacing between the excitation pulses and the corresponding echoes, the effects of coincident motion of the heart were effectively eliminated.

All human studies were carried out with informed consent using an IRB-approved research protocol.

Example 2

Preparing Frequency Maps

Figures 6, 7:
FIG. 6 is the average of the frequency maps of FIGS. 5a-5h.
FIG. 7 is an MRI image of a human heart with the MR imager having been shimmed using a frequency map prepared using MRI signals obtained using the pulse sequence of FIG. 4.

Frequency maps prepared from the set 212' of MRI signals are shown in FIGS. 5a-5h. The average of these frequency maps is shown in FIG. 6. The frequency maps are nearly identical even though the frequency maps were obtained during different breath holds and between different heartbeats so that the heart was not in exactly the same position for each acquisition.

The frequency maps of FIGS. 5a-5h were acquired in the presence of a velocity encoding gradient. However, the velocity encoding gradient is not required for obtaining the frequency maps. The velocity encode affects only the phase change in the axis of velocity encoding (i.e. the change in phase with distance). When the same pixel of each of two images is compared to determine the frequency, the velocity encode cancels out.

The frequency maps of FIGS. 5a-5h were used for cardiac shimming. Referring to FIG. 7, an MR image of the heart, shimmed using the frequency map data discussed above is shown.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A magnetic resonance imaging (MRI) method comprising:
    performing a pulse sequence including excitation pulses and magnetic gradients designed to excite first and second spin populations within a slice of an object, to have different phase histories;
    acquiring MRI signals from the first and second spin populations at different times;
    using the MRI signals to determine a phase difference between the MRI signals from the first and second spin populations;
    using the determined phase difference to determine a magnetic field strength difference between different portions of the slice; and
    using the determined magnetic field strength difference between different portions of the slice, preparing a frequency map indicative of differences in a precessional frequency of the spin populations in the slice.

2. The MRI method of claim 1, wherein the pulse sequence comprises:
    subjecting the slice to a first radio frequency (RF) pulse;
    subjecting the slice to a second RF pulse; and
    at a time between the first and second RF pulses, subjecting the slice to a dephasing gradient.

3. The MRI method of claim 1, wherein the pulse sequence further comprises subjecting the first and second populations to a radio frequency (RF) focusing pulse.

4. The MRI method of claim 2, wherein the steps of subjecting the slice to a first RF pulse and subjecting the slice to a second RF pulse are performed within 1 ms of one another.

5. The MRI method of claim 2, wherein the steps of subjecting the slice to a first RF pulse and subjecting the slice to a second RF pulse are performed within 500 ps of one another.

6. The MRI method of claim 2, wherein the first and second RF pulses have a total tip angle of 90° or less.

7. The MRI method of claim 1, further comprising shimming a magnetic resonance imaging system based on the field strength differences and using the frequency map, wherein the magnetic resonance imaging system was used to generate the first and second spin populations.

8. A magnetic resonance imaging (MRI) method comprising:
    subjecting an object to first and second radio frequency (RF) excitation pulses spaced apart by less than 1 ms;
    receiving a set of MRI signals, wherein the set of MRI signals comprises a plurality of subsets of MRI signals, each subset of MRI signals comprising a first echo signal from the first RF excitation pulse and a second echo signal from the second RF excitation pulse, and wherein the MRI signals of a given subset arise from the same portion of the object, and the MRI signals of different subsets of MRI signals arise from different portions of the object; and
    using the subsets of MRI signals to determine a field strength difference between different portions of the object.

9. The method of claim 8, further comprising subjecting the object to a dephasing gradient at a time between subjecting the object to the first and second RF excitation pulses.

10. The method of claim 9, further comprising subjecting the object to a rephasing RF pulse after subjecting the object to the first and second RF excitation pulses.

11. The method of claim 9, wherein receiving a set of MRI signals comprises subjecting the object to a set of readout gradients, wherein one subset of MRI signals is received during each readout gradient.

12. The method of claim 11, further comprising subjecting the object to a prephasing gradient prior to subjecting the object to the set of readout gradients.

13. The method of claim 12, wherein a ratio of the area of the prephasing gradient to the area of each readout gradient is about ¼.

14. The MRI method of claim 8, further comprising preparing, based on the field strength differences between different portions of the slice, a frequency map indicative of differences in a precessional frequency of the spin populations in different portions of the slice.

15. The MRI method of claim 8, further comprising shimming a magnetic resonance imaging system based on the field strength differences between portions of the slice, wherein the magnetic resonance imaging system was used to subject the object to first and second (RF) excitation pulses.

16. A magnetic resonance imaging (MRI) method comprising:
    subjecting a slice of an object to a first radio frequency (RF) excitation pulse, the first RF excitation pulse having a tip angle of less than 90°;
    subjecting the slice to a second RF excitation pulse, the second RF excitation pulse having a tip angle of less than 90°, wherein the first and second RF excitation pulses excite the same slice of the object;
    subjecting the slice of the object to a dephasing gradient at a time between the first and second RF excitation pulses;
    subjecting the slice of the object to a prephasing gradient; then, subjecting the slice of the object to a plurality of readout gradients;
    during each readout gradient, obtaining first and second MRI signals, wherein the first and second MRI signals obtained during each readout gradient arise from the same portion, and the MRI signals obtained during different readout gradients arise from different portions; and
    using the first and second MRI signals obtained from each portion to determine a field strength difference between different portions of the slice.

17. The MRI method of claim 16, further comprising preparing, based on the field strength differences between different portions of the slice, a frequency map indicative of differences in a precessional frequency of the spin populations in different portions of the slice.

18. The MRI method of claim 16, further comprising shimming a magnetic resonance imaging system based on the field strength differences between portions of the slice, wherein the magnetic resonance imaging system was used to subject the object to first and second (RF) excitation pulses.

19. A method for acquiring a medical image of a subject using a magnetic resonance imaging system, the method comprising:
    a) exciting, with the MRI system, a region of interest (ROI) within the subject using a first excitation pulse;
    b) waiting a predetermined time delay ($\Delta\tau$);
    c) exciting, with the MRI system, the ROI within the subject using a second excitation pulse;
    d) acquiring, with the MRI system, a set of MRI signals from the ROI;
    e) determining phase differences ($\Delta\phi$) between subsets of the MRI signals;
    f) generating at least one of a frequency map and a field strength map, using at least one of 1) the phase differences and time delay and 2) a relation of at least one of the phase differences and time delay to at least one of precessional frequency ($\omega$) of spin species in the ROI and magnetic field strength variations ($\Delta B_0$) of a static magnetic field of the MRI system across the ROI.

20. The method of claim 19 further comprising (h) shimming a static magnetic field of the MRI system using at least one of the frequency map and a field strength map to compensate for variations in the static magnetic field of the MRI system.

21. The method of claim 19 further comprising:
    g) using the at least one of the frequency map and a field strength map and the MRI system, exciting the ROI within the subject using a pulse sequence configured to suppress fat;
    h) acquiring, with the MRI system, another set of MRI signals having signals associated with fat in the ROI substantially suppressed.

22. The method of claim 19 wherein the at least one of the frequency map and a field strength map are generated using a relationship of time delay ($\Delta\tau$) between the first and second excitation pulses, phase differences ($\Delta\phi$) between subsets of the MRI signals; precessional frequency ($\omega$) of spin species in the ROI, and magnetic field strength variations ($\Delta B_0$) of the static magnetic field of the MRI system as follows:

$$\omega_i = \gamma B_{0i} = \gamma(B_0 - \Delta B_{0i}) = \Delta\phi_i/\Delta\tau;$$

where $\omega_i$ is the precessional frequency of a given corresponding subset of the MRI signals, $\gamma$ is a constant, $B_{oi}$ is the magnetic field strength at a location in the ROI associated with given corresponding subset of the MRI signals, $B_0$ is the magnetic field strength of the static magnetic field of the MRI system, $\Delta B_{0i}$ is a variation of the magnetic field strength at a location in the ROI associated with given corresponding subset of the MRI signals, and $\Delta\Phi_i$ is a phase difference between the given corresponding subset of the MRI signals.

* * * * *